May 9, 1961 S. ZECHTER 2,983,875

EMITTER-FOLLOWER COUPLED MULTISECTION FILTER CIRCUIT

Filed April 18, 1958

INVENTOR.
SOL ZECHTER
BY
Robert D. Sanborn
ATTORNEY

United States Patent Office 2,983,875
Patented May 9, 1961

2,983,875

EMITTER-FOLLOWER COUPLED MULTISECTION FILTER CIRCUIT

Sol Zechter, Broomall, Pa., assignor to Philco Corporation, Philadelphia, Pa., a corporation of Pennsylvania Filed Apr. 18, 1958, Ser. No. 729,414

7 Claims. (Cl. 330—21)

The present invention relates to improvements in filter networks and more particularly to improvements in so-called active filter networks.

There are many systems which require the use of audio filters of miniature size. Airborne systems such as air-borne radar systems, telemetering systems and interplane communication systems are typical examples. Miniature filters also find application in similar shipboard and land based electronic systems and wherever size, weight or cost is a factor to be considered in the design.

Low frequency passive filters have the disadvantage that relatively large inductance values are required if relatively high input impedance to the filter is desired. As a result, low frequency passive filters require relatively large amounts of space and are relatively heavy and expensive. Attempts have been made to overcome these disadvantages of passive filters by replacing the inductors by a combination of capacitors and active elements so arranged as to present an inductive impedance at the output terminals thereof. Still other attempts have been made to increase the apparent inductance of a small physical inductor through the use of active circuits. Some success has been achieved in reducing the volume of these types of active filters below that of the passive filter of similar passband characteristics. However active filters of the type mentioned have a limited dynamic range, a relatively high insertion loss and a relatively large power consumption. The characteristics of the filters are highly dependent on supply voltage and temperature. The cost of an active filter may be of the order of ten to twenty times that of the passive filter it replaces and much more time and labor is required in designing the filter.

It is an object of the present invention to provide a novel active filter circuit which occupies much less space than equivalent active or passive filters.

Still another object of the invention is to provide a highly stable active filter network having an insertion loss and a dynamic range comparable to that of a passive filter.

Still another object of the invention is to provide a novel active filter circuit which has relatively few parts and requires very little power.

In general, the invention comprises two or more filter sections connected in cascade by means of impedance-reducing electron amplifier stages inserted between adjacent filter sections. In certain preferred forms of the invention the filter sections may comprise simple inductor-capacitor networks. The impedance-reducing electron amplifier stages may comprise transistor-emitter follower circuits.

Figure 1:
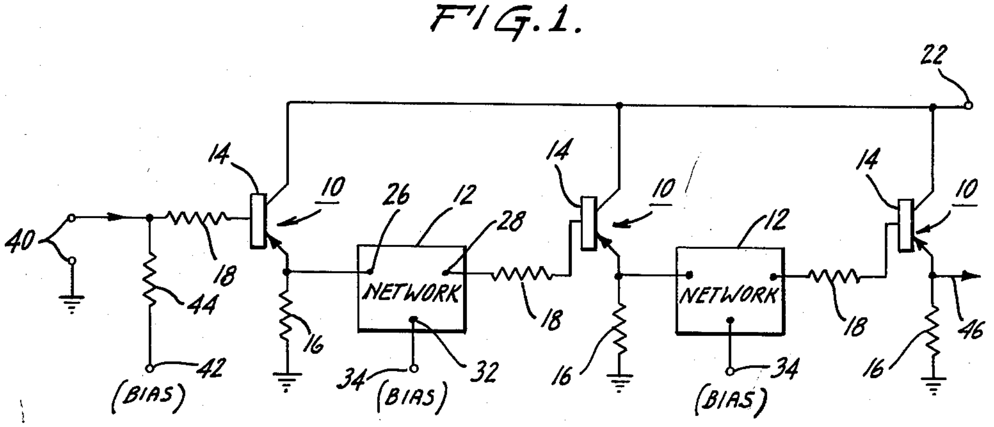
Figure 2:
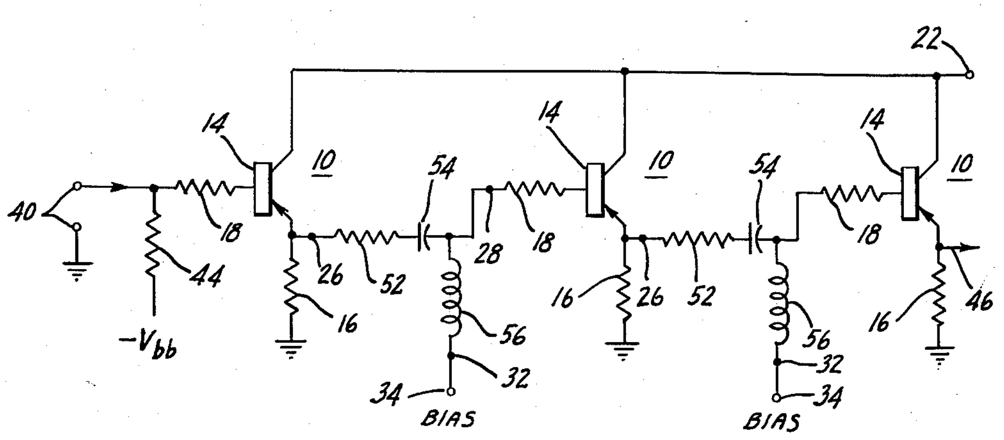

For a better understanding of the present invention together with other and further objects thereof reference should now be made to the following detailed description which is to be read in conjunction with the accompanying drawings in which:

Fig. 1 is a circuit diagram, partly in block form, of the present invention; and Fig. 2 is a schematic diagram of one preferred embodiment of the invention.

The circuit of Fig. 1 comprises two frequency selective networks 12 which are separated by an emitter-follower stage 10. Additional emitter-follower stages 10 form the input and output circuits of the cascade arrangement. Each emitter-follower stage may comprise a transistor 14, a load resistor 16 and a base resistor 18. The collector of each of the transistors 14 is connected to one terminal of a source of supply potential which is represented in Fig. 1 by the terminal 22. The other terminal of the supply source may be at ground potential. Thus the source is connected across the series combination of transistor 14 and load resistor 16. The polarity of terminal 22 of the source will depend on the type of transistor employed.

Networks 12 are shown as three terminal networks in which the input terminal 26 is connected to the emitter of one transistor 14 while the output terminal 28 is connected through the base resistor 18 to the base of the following transistor 14. The common terminal 32 of such network 12 is shown connected to a source of base bias potential schematically represented by terminal 34. The purpose of bias source 34 is to supply the usual operating bias for the base of the following emitter-follower circuit 10. Therefore, in embodiments of the invention employing a four-terminal network in place of one or more of the three terminal networks 12, the second input terminal may be connected to ground and the second output terminal may be connected to source 34.

The first emitter-follower stage 10 is provided with input connections 40 to which the signal to be processed may be supplied. The first stage 10 is provided with a source of bias potential 42 through an isolating resistor 44 and base resistor 18. In practice, one common bias source may be provided in place of the individual sources 42 and 34. An output connection 46 may be provided at the emitter of the final emitter-follower stage 10.

The two networks 12 shown in Fig. 1 need not, and in many instances will not, have identical characteristics. In most instances these two networks will have quite different pole-zero configurations in order to obtain the desired overall passband for the filter networks. The emitter-follower stages provide sufficient isolation between adjacent networks so that the reaction of one network on the other may be, in general, ignored. The isolation between adjacent networks 12 is further enhanced by placing the poles of one network 12 as far as possible from the poles of the adjoining network. The impedance step down provided by the emitter-follower stages 10 permits the elements of similar frequency selective networks in different parts of the cascade arrangement to have impedance values of the same order of magnitude. Since it is not necessary to change the physical size of successive filter elements to obtain a progressive change in the impedance levels of the selective circuits, the elements of all of the frequency-selective circuits may be of relatively small physical size.

Only two networks 12 have been shown in Fig. 1 but additional networks may be added to obtain the desired passband characteristic. Additional emitter-follower stages 10 may be added to separate each added network from the other network in the cascade arrangement. As indicated above, the relatively simple pole-zero techniques may be employed in designing a particular passband in place of the much more complicated calculations required by passive filter theory.

The use of emitter-follower stages yields voltage gains approaching unity in each section. Since the collectors of the transistors are at A.C. ground potential, the noise output of the filter is very low. The use of emitter followers causes the response within the passband to have excellent linearity. The circuit disclosed is substantially independent of changes in supply voltages or temperature over wide ranges. The circuit is well adapted to potting or other packaging techniques. Only two power terminals are required in addition to the necessary input and output terminals. The high input impedance and low output impedance of the emitter-follower stage, together with the isolation between adjacent networks 12, makes it possible to employ inductors of smaller size than can be employed in equivalent passive filters.

A typical filter constructed in accordance with the teachings of the present invention may have a volume approximately one-eighth that of the corresponding passive filter and less than one-third that of the equivalent active filter employing negative impedance converters. This typical filter requires only about one-tenth the number of transistors and one-tenth the input power required by active filters employing negative impedance converters. This smaller, less expensive filter of the present invention may be constructed to have a dynamic range of 75 db as compared to 100 db for a passive filter and only 35 db for active filters employing negative impedance converters. The insertion loss of the filter of the present invention can be made as low as 0.5 db per section which compares favorably with a typical value of 0.3 db per section for a passive filter and is far below the insertion loss for active filters employing negative impedance converters which may run as high as 6 to 10 db per section.

Fig. 2 is included by way of further illustration of a preferred embodiment of the present invention. The circuit of Fig. 2 is a high pass filter circuit employing two networks and three emitter-follower stages. Components in Fig. 2 corresponding to similar components in Fig. 1 have been identified by the same reference numerals. As shown in Fig. 2, each network 12 of Fig. 1 has been replaced by a circuit made up of a resistor 52, a capacitor 54, and an inductor 56 connected in series between input terminal 26 and common terminal 32. The output terminal of the network is at the junction of capacitor 54 and inductor 56. As indicated above, it is not necessary to arrange the network 12 into a T or $\pi$ network having the same input and output impedance. Each emitter-follower stage functions as a low impedance source for the network which follows it and a high impedance load across the network that precedes it.

The circuit of Fig. 2 may be converted to a low pass filter by interchanging capacitor 54 and inductor 56. Other forms of passbands can be selected by applying well known pole-zero techniques to the selection of the characteristics of the individual networks.

Transistor-emitter follower circuits are ideally suited for use in the circuits just described because of their small physical size, low power drain and desirable input impedance versus output impedance ratio. However it lies within the scope of the present invention to employ other forms of impedance-reducing amplifier stages, particularly vacuum tube cathode-follower circuits.

While the invention has been described with reference to the preferred embodiments thereof, it will be apparent that various modifications and other embodiments thereof will occur to those skilled in the art within the scope of the invention. Accordingly I desire the scope of my invention to be limited only by the appended claims.

What is claimed is:

1. An audio frequency filter provided with first and second terminals to which a source of emitter bias potential may be connected, said filter further comprising a plurality of emitter-follower stages and a plurality of filter sections coupled together to form a cascade arrangement of alternately occurring emitter-follower stages and filter sections, each of said emitter-follower stages comprising a transistor and a resistor, the collector of said transistor being connected to said first terminal, said resistor being connected between said second terminal and the emitter of said transistor, each of said filter sections comprising a decoupling resistor connected at a first end to the emitter of the transistor in the preceding emitter-follower stage of said cascade arrangement, and a network including at least an inductor and a capacitor, said inductor-capacitor network being connected between the second end of said decoupling resistor and a point of fixed potential, said first end of said decouplying resistor comprising an input terminal of said filter section, said network being provided with a terminal which comprises the output terminal of said filter section, means coupling said output terminal to the base of the following transistor in said cascade arrangement, the input impedance of each of said filter sections measured between said input terminal and said point of fixed potential being different from the output impedance of that section measured between said output terminal and said point of fixed potential over a substantial portion of the audio frequency band of interest, the input impedances of the several filter sections being of the same order of magnitude, adjacent filter sections in said cascade arrangement having different pole-zero configurations.

2. An audio frequency filter provided with first and second terminals to which a source of emitter bias potential may be connected, said filter further comprising $n$ emitter-follower stages where $n$ is an integer greater than two, each of said stages comprising a transistor and a resistor, the collector of said transistor being connected to said first terminal, said resistor being connected between said second terminal and the emitter of said transistor, $n-1$ audio frequency filter sections coupling said emitter-follower stages together to form a cascade arrangement of alternately occurring emitter-follower stages and filter sections, each of said filter sections, comprising a decoupling resistor connected at a first end to the emitter of the transistor in the preceding emitter-follower stage of said cascade arrangement and a network including at least an inductor and a capacitor, said inductor-capacitor network being connected between the second end of said decoupling resistor and a point of fixed potential, said first end of said decoupling resistor comprising an input terminal of said filter section, said inductor-capacitor network being provided with a terminal which comprises an output terminal of said filter section, means coupling said output terminal to the base of the following transistor in said cascade arrangement, the input impedance of each of said filter sections measured between said input terminal and said point of fixed potential being different from the output impedance of that section measured between said output terminal and said point of fixed potential over a substantial portion of the audio frequency band of interest, the input impedances of the several filter sections being of the same order of magnitude, adjacent filter sections in said cascade arrangement having different pole-zero configurations.

3. An audio frequency filter in accordance with claim 2 wherein said means coupling said output terminal of said filter section to the base of the following transistor comprises a second decoupling resistor.

4. An audio frequency filter provided with first and second terminals to which a source of emitter bias potential may be connected, said filter further comprising $n$ emitter-follower stages where $n$ is an integer greater than two, each of said stages comprising a transistor and a resistor, the collector of said transistor being connected to said first terminal, said resistor being connected between said second terminal and the emitter of said transistor, $n-1$ audio frequency filter sections coupling said emitter-follower stages together to form a cascade arrangement of alternately occurring emitter-follower stages and filter sections, each of said filter sections comprising a decoupling resistor connected at a first end to the emitter of the transistor in the preceding emitter-follower stage of said cascade arrangement and a series circuit including an inductor and a capacitor, said series circuit being connected between the second end of said decoupling resistor and a point of fixed potential, said first end of said decoupling resistor forming an input terminal of said filter section, means coupling an intermediate point on said series circuit to the base of the following transistor in said cascade arrangement, the input impedance of each of said filter sections measured between said input terminal and said point of fixed potential being different from the output impedance of that section measured between said intermediate point on said series circuit and said point of fixed potential over a substantial portion of the audio frequency band of interest, the input impedances of the several filter sections being of the same order of magnitude, adjacent filter sections in said cascade arrangement having different pole-zero configurations.

5. A filter in accordance with claim 4 wherein said means coupling said intermediate point on said series circuit to the base of the following transistor comprises a second decoupling resistor.

6. An audio frequency filter provided with first and second terminals to which a source of emitter bias potential may be connected, said filter further comprising $n$ emitter-follower stages where $n$ is an integer greater than two, each of said stages comprising a transistor and a resistor, the collector of said transister being connected to said first terminal, said resistor being connected between said second terminal and the emitter of said transistor, $n-1$ audio frequency filter sections coupling said emitter-follower stages together to form a cascade arrangement of alternately occurring emitter-follower stages and filter sections, each of said filter sections comprising a decoupling resistor connected at a first end to the emitter of the transistor in the preceding emitter-follower stage of said cascade arrangement, a capacitor having one terminal connected to the second end of said decoupling resistor, and an inductor connected between a second terminal of said capacitor and a point of fixed reference potential, means coupling said second terminal of said capacitor to the base of the transistor in the following stage, the input impedance of the respective filter sections measured between the first end of said decoupling resistor and said point of reference potential being of the same order of magnitude for the several sections.

7. A filter in accordance with claim 6 wherein said means coupling said second terminal of said capacitor to the base of the transistor in the following stage comprises a second decoupling resistor.

References Cited in the file of this patent

UNITED STATES PATENTS

| | | |
|---|---|---|
| 2,121,150 | Jarvis | June 21, 1938 |
| 2,122,193 | Bedford | June 28, 1938 |
| 2,510,868 | Day | June 6, 1950 |
| 2,549,761 | Adams | Apr. 24, 1951 |
| 2,627,931 | Flewelling | Feb. 10, 1953 |
| 2,671,856 | Cormak | Mar. 9, 1954 |
| 2,761,921 | Kuhl | Sept. 4, 1956 |
| 2,864,904 | Jensen | Dec. 16, 1958 |

OTHER REFERENCES

Electronic Design, June 1, 1957, pages 38 to 41 by Philip J. Anzalone.